United States Patent
Wouters

(10) Patent No.: US 7,019,588 B2
(45) Date of Patent: Mar. 28, 2006

(54) METHOD TO DYNAMICALLY CONTROL THE QUIESCENT CURRENT OF AN OPERATIONAL AMPLIFIER ARRANGEMENT AND OPERATIONAL AMPLIFIER ARRANGEMENT PERFORMING THIS METHOD

(75) Inventor: Patrick August Maria Wouters, Hamme-Merchtem (BE)

(73) Assignee: Alcatel, Paris (FR)

( * ) Notice: Subject to any disclaimer, the term of this patent is extended or adjusted under 35 U.S.C. 154(b) by 611 days.

(21) Appl. No.: 10/139,391

(22) Filed: May 7, 2002

(65) Prior Publication Data

US 2002/0171479 A1 Nov. 21, 2002

(30) Foreign Application Priority Data

May 18, 2001 (EP) ............................................ 01401312

(51) Int. Cl.
*H03F 3/45* (2006.01)

(52) U.S. Cl. ........................................ 330/69; 330/252
(58) Field of Classification Search ................... 330/69, 330/75, 9, 109, 252, 255, 258, 259, 261
See application file for complete search history.

(56) References Cited

U.S. PATENT DOCUMENTS

| 4,251,803 | A | | 2/1981 | Debord et al. |
| 4,359,739 | A | | 11/1982 | Noy |
| 4,439,743 | A | | 3/1984 | Schwarz et al. |
| 4,502,020 | A | | 2/1985 | Nelson et al. |
| 4,752,745 | A | | 6/1988 | Pass |
| 4,949,048 | A | * | 8/1990 | Tokumo et al. ................ 330/10 |
| 5,307,407 | A | * | 4/1994 | Wendt et al. ................ 379/418 |
| 5,479,337 | A | * | 12/1995 | Voigt ............................ 330/10 |
| 5,789,974 | A | | 8/1998 | Ferguson, Jr. et al. |
| 6,262,632 | B1 | * | 7/2001 | Corsi et al. .................. 330/251 |
| 2002/0171478 | A1 | | 11/2002 | Wouters |

OTHER PUBLICATIONS

Casier H et al.: "A 3.3–V, Low–Distortion ISDN Line Driver with a Novel Quiescent Current Control Circuit" IEEE Journal of Solid–State Circuits, IEEE Inc., New York, US, vol. 33, No. 7, Jul. 1998, pp. 1130–1133, XP000849173.

* cited by examiner

*Primary Examiner*—Khanh V. Nguyen
(74) *Attorney, Agent, or Firm*—Sughrue Mion, PLLC

(57) ABSTRACT

A method for controlling the quiescent output current of an operational amplifier arrangement by tuning offset voltages of a stage preceding a differential output driver stage. The cut-off frequency of the filter formed by the input capacitors of the differential output driver stage and the output impedance of the stage preceding the differential output driver stage is selected so that the cut-off frequency is lower than a predetermined part of the maximum bandwidth of the input signal (vin) applied to the operational amplifier arrangement. The stage preceding the differential output driver stage is designed to be limited in output swing. The invention relates as well to an operational amplifier designed in accordance with the subject methodology.

5 Claims, 4 Drawing Sheets

METHOD TO DYNAMICALLY CONTROL THE QUIESCENT CURRENT OF AN OPERATIONAL AMPLIFIER ARRANGEMENT AND OPERATIONAL AMPLIFIER ARRANGEMENT PERFORMING THIS METHOD

FIELD OF THE INVENTION

The present invention relates to a method for controlling the quiescent current of an operational amplifier arrangement, and to an operational amplifier arrangement which is adapted to perform such a method.

BACKGROUND OF THE INVENTION

A method and amplifier arrangement to control the quiescent current are already known in the art, e.g. from the article "*A 3.3 V Low-distortion ISDN Line Driver with a Novel Quiescent Current Control Circuit*", written by H. Casier, P. Wouters, B. Graindourze and D. Sallaerts, *IEEE Journal of Solid-State Circuits*, Vol. 33, Nr 7, July 1998, pp. 1130–1133. Therein, on page 1132, an amplifier arrangement including a quiescent current control circuit is shown and described. Basically, the currents flowing in each of the two output branches of the output stage of the operational amplifier are sensed and compared in a comparator, which consists of a simple inverter and a phase detector. Comparison with a reference current Iref is performed. The output of the comparator is fed back to the input stage of the amplifier arrangement via a charge pump circuit which charges or discharges a hold capacitor, dependent on this comparator output signal: if both sensed output currents are higher than the target reference or quiescent current, the capacitor is discharged; if both sensed output currents are lower than the target quiescent current, the capacitor is charged. The charge on the capacitor is further transformed via a buffer and an attenuator into a voltage difference between the positive input terminals of both error amplifiers preceding the output stage. This voltage difference, corresponding to the quiescent offset voltage, can be considered as a change in the input offset voltage of both amplifiers.

A drawback of this prior art method is however that the quiescent current level is set statically, thus without any frequency dependency. Therefore the quiescent current has to be dimensioned for the worst-case signal, i.e. the input signal which is the highest in frequency. This however results in a waste of power, as the quiescent current is thereby over-dimensioned for the lower frequency signals.

SUMMARY OF THE INVENTION

An object of the present invention is to provide a method for controlling the quiescent current of an operational amplifier arrangement, but whereby the quiescent current is set such as to be dependent on the frequency of the input signal.

According to the invention, this object is achieved due to the fact that the method further includes a step of selecting the cut-off frequency of the filter formed by the input capacitors of the differential output driver stage and the output impedance of the stage preceding the differential output driver stage such that the cut-off frequency is lower than a predetermined part of the maximum bandwidth of the input signal (vin) applied to the operational amplifier arrangement. In addition, the stage preceding the differential output driver stage is designed such as to be limited in output swing. The object is further achieved in that an operational amplifier arrangement includes a differential output driver stage, input terminals of which are coupled to respective output terminals of a stage preceding the differential output driver stage. The operational amplifier arrangement further includes a quiescent current control circuit adapted to control the quiescent current of the differential output driver stage by tuning respective input offset voltages of the stage preceding the differential output driver stage. A filter formed by the output impedance of the stage preceding the differential output driver stage and the input capacitors of the differential output driver stage has a cut-off frequency that is lower than a predetermined part of the maximum bandwidth of the input signal (vin) of the operational amplifier arrangement. The stage preceding the differential output driver stage is limited in output swing.

In this way, the cut-off frequency of the inherent filter which is formed by the input capacitors of the transistors of the differential output stage and the output impedance of the previous stage, is selected or designed such that this is lower than the maximum frequency of the input signal. In combination with the fact that this previous stage is limited in output swing, a higher quiescent output current for the frequencies that lie beyond this cut-off frequency is achieved. Input signals having higher frequencies will thus result in a higher quiescent current. The static power budget can thus be reduced by more than 50% compared to an equivalent non-dynamic control architecture.

Another characteristic feature of the present invention is that the stage preceding the differential output driver stage includes a pair of differential amplifiers, and a differential amplifier of the pair includes a differential pair of transistors in a common emitter circuit coupled to a current source. The collector output terminals of both transistors of the differential pair are coupled via a load to the supply voltage.

Thereby the stage preceding the differential output stage can be chosen as to have a very simple architecture. Similarly, the differential output stage is a class AB amplifier 4, which can also have a very simple architecture.

It is to be noticed that the term 'coupled', used in the claims, should not be interpreted as being limitative to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

It is to be noticed that the term 'comprising', used in the claims, should not be interpreted as being limitative to the means listed thereafter. Thus, the scope of the expression 'a device comprising means A and B' should not be limited to devices consisting only of components A and B. It means that with respect to the present invention, the only relevant components of the device are A and B.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DESCRIPTION OF THE PREFERRED EMBODIMENT

Figure 1:
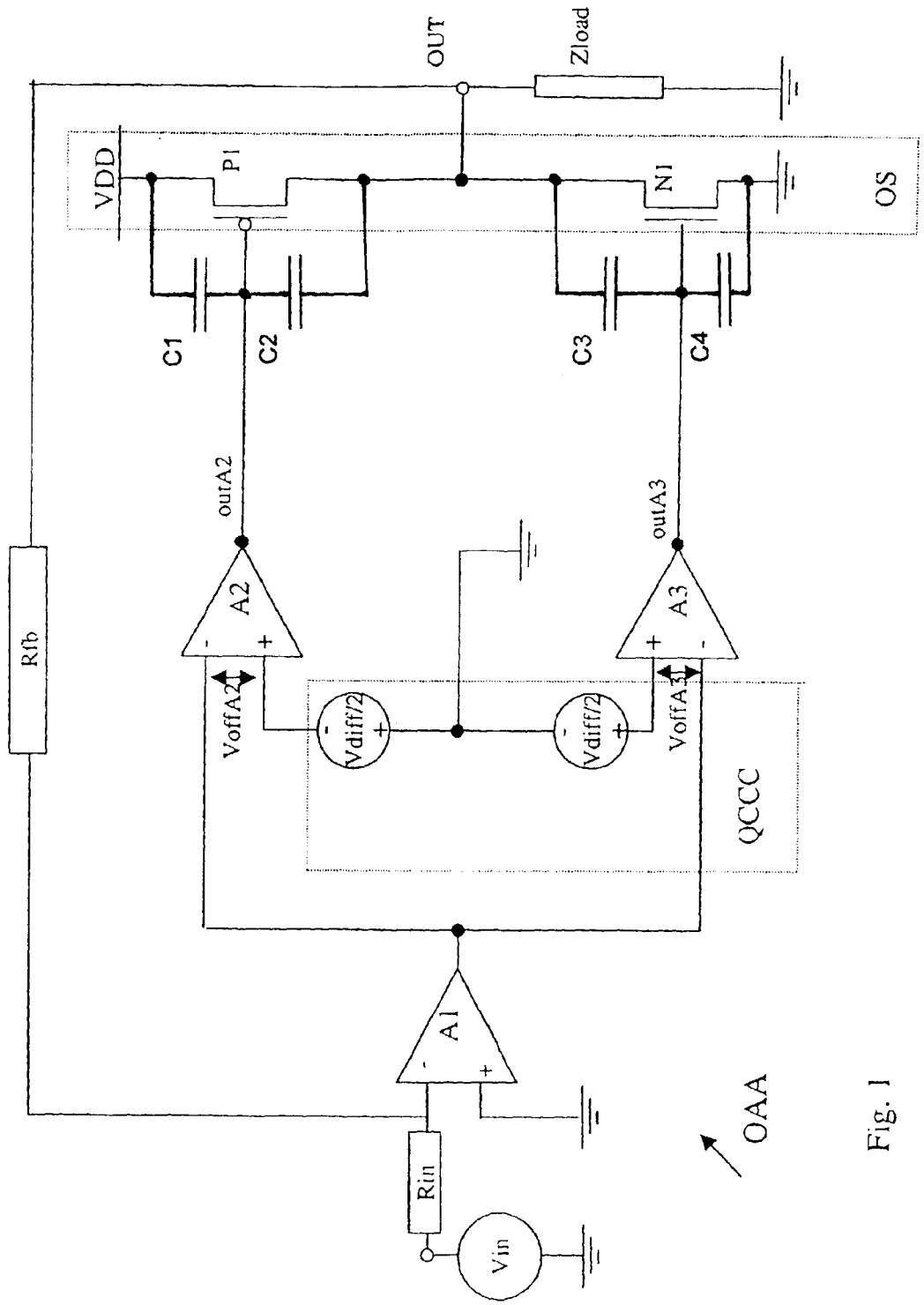
FIG. 1 represents a schematic of a general amplifier arrangement wherein the method of the invention is realized.

The operational amplifier arrangement as depicted in FIG. 1 is for instance used in ADSL or VDSL or, in general xDSL line drivers. ADSL is the abbreviation of asymmetric digital subscriber line whereas VDSL is the abbreviation of very high speed digital subscriber line. xDSL thereby stands for all possible digital subscriber line applications.

The requirements in these xDSL applications are very stringent: high bit rate, long reach, less than 10E-7 bit error rate, which translates itself into severe requirements for noise and distortion performance. Furthermore the input signals show a high Crest factor, being the ratio between the peak and the RMS voltage on the line.

Therefore the control of the quiescent current level of the output stage has to be done very accurately, and preferably being insensitive to process and temperature variations.

On the other hand power consumption needs to be minimized as much as possible, whereas influence on the signal path has to be avoided.

Furthermore it is desirable that this quiescent current should be dynamically controllable. Indeed, dynamically controlling the quiescent current allows for a higher quiescent current level where needed by increasing the quiescent current level as a function of the input and thus also of the amplified signal frequency. By increasing the quiescent current at higher frequencies, the distortion level at these higher frequencies is reduced in an efficient way. In addition the overall power consumption is substantially reduced, since the quiescent current level will only be selectively increased for the signals in the higher frequency range. This is in contrast to the known static quiescent current control techniques which all aim at a preset target level for the quiescent current for all frequencies. With a dynamic quiescent current control technique it is possible to set a lower quiescent current for the lower frequency signals and a higher quiescent current for the higher frequency signals, thereby reducing overall power consumption. The higher quiescent currents are desirable at these higher frequencies for distortion reasons: due to the dominant pole of the operational amplifier, the loop gain will decrease at the higher frequencies. The result is that the distortion at these higher frequencies will also be higher. This can however be overcome by a higher quiescent current at these higher frequencies.

The operational amplifier arrangement and the quiescent current control method of the present invention are thereby capable of providing a solution to the aforementioned requirements as will be explained below.

The operational amplifier arrangement depicted in FIG. 1 includes a common input stage A1 which is receiving the input signal, for instance the D/A converted ADSL signal as received from a processor. The output terminal OUT of this operational amplifier arrangement is then coupled to the load which can consist of the line impedance in case of the aforementioned ADSL signal. The load impedance that is driven by the output amplifier and is coupled to the output terminal of the amplifier arrangement, is denoted with Zload in FIG. 1.

For linearity and stability reasons this output signal is fed back to the input of the common input stage A1 via a feedback circuit, indicated as Rfb.

The output terminal of A1 is coupled to input terminals of two offset amplifiers A1 and A2, which together form the stage preceding the final differential output driver stage OS. Because of the stringent linearity reasons for xDSL output amplifiers, OS consists of a class AB amplifier for these applications. However the invention is as well applicable to other types of output amplifiers. A class AB amplifier, in its simplest form, basically consists of a p-type transistor P1 in series with an n-type transistor N1. In the embodiment depicted in FIG. 1 both P1 and N1 are CMOS transistors, but implementations in other technologies such as bipolar technologies are also possible.

The quiescent current is defined as the current that is flowing in the output stage OS when no input signal Vin is applied. Such a current originates from the DC bias conditions. Since variations on this current directly add to the power consumption in the load ZLOAD, the value of the quiescent current has to be set as accurate as possible. This is the function of a Quiescent Current Control Circuit, abbreviated with QCCC, and which, in its most basic form, includes circuitry for adjusting the input offset voltages VoffA2 and VoffA3 of the two differential amplifiers A2 and A3 of the stage preceding the differential output driver stage. This circuitry is schematically depicted as two voltage sources, Vdiff2 and Vdiff3 in FIG. 1, and may consist in one embodiment of the present invention of D/A converters. The quiescent current control circuit may in more complex embodiments further include other circuitry for adaptively tuning these offset levels, based on a measurement of the output currents. These circuits are for instance described in the already mentioned prior art article.

These presently known quiescent current control circuits however do not dynamically control the quiescent current. A dynamic regulation is achieved by a following a particular design methodology for both the differential output driver stage OS and the stage preceding this output driver stage. This design is thereby such that the cut-off frequency of the filter which is formed by the input capacitors C1, C2, C3, C4 of the input transistors of the output stage, and the output impedance of the stage preceding this output stage, is lower than a predetermined percentage of the maximum bandwidth of the input signal. Dependent on the specific requirements, this predetermined percentage can be chosen as 70, 80 or even 100%, as being influenced by external requirements such as the distortion specification. In an example of an ADSL line driver that has a signal bandwidth of approximately 140 KHz and a distortion specification of smaller than—70 dB for a 100 kHz sine wave input, this cut-off frequency is set at to be at 50 KHz.

The target for the constant quiescent current setting at low frequencies is set at 5 mA for this application.

Figure 2:
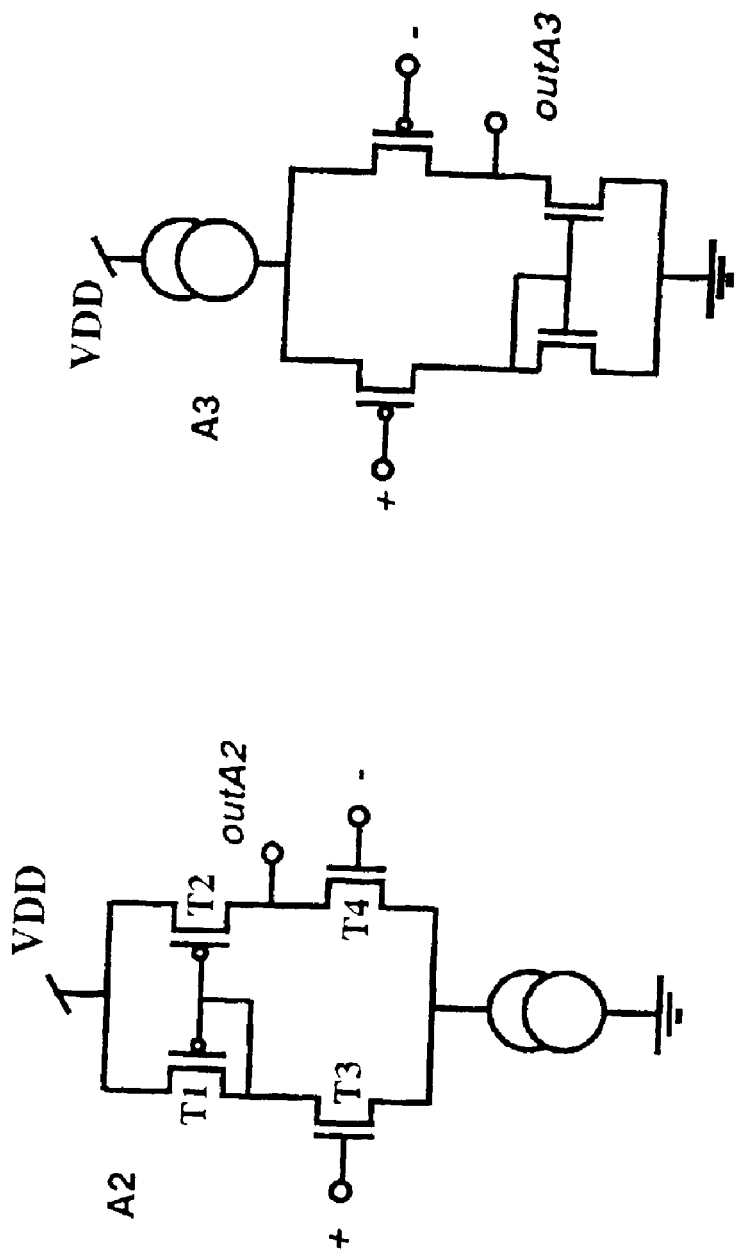
FIG. 2 represents a transistor schematic implementation of the amplifiers A2 and A3 together constituting the stage preceding the output stage and which are shown in FIG. 1.

An additional and mandatory design feature for the dynamic behavior of the quiescent current control is that the stage preceding the output stage, has to be limited in output swing. Herewith is meant that the output signal provided by these amplifiers is clipping to the supply voltages, for the higher input voltages received by these amplifiers. The level of clipping can be chosen and is not limitative to the design methodology. A simple transistor embodiment realizing such a stage of which the amplifiers are limited in output swing, is shown in FIG. 2. Therein an embodiment for the differential amplifiers A2 and A3 are shown. It is to be remarked that, although CMOS transistor embodiments are shown, an embodiment whereby the nMOS transistors are replaced by npn bipolars, and whereby the pMOS transistors are replaced by pnp bipolars, is as well possible.

Differential amplifier A2 thereby basically consists of a differential transistor pair of transistors T3 and T4, in a common-emitter or common-source circuit scheme. For T3 and T4 being nMOS transistors, their sources are coupled together to one terminal of a current source Is. Another terminal of that current source is coupled to the ground reference terminal.

The drains of transistors T3 and T4 are coupled via a resistive load to the supply voltage terminal VDD. In the embodiment depicted in FIG. 2, these resistive loads are realized by means of respective transistors T1 and T2. The drain terminal of T4 further serves as the output terminal of amplifier A2.

A similar transistor level embodiment is shown in FIG. 2 for amplifier A3.

Because of the limited output swing of amplifiers A2 and A3 they cannot compensate for the loss that is caused by the inherent filter. Basically the overall amplifier wants to make sure it is presenting the correct voltages to the gates of N1 and P1 of the output driver stage, such as to ensure the proper quiescent current levels. To reach this goal the amplifiers A2 and A3 have to compensate for the loss caused by the filer, by further boosting up their output swing. In the direction of the output signal towards the analog ground, which is lying in between the supply voltage and the ground potential, the output transistors are completely turned on, and there is no problem. In the direction of the output swing towards the supply and the ground potential however, the transistors TN2 and TP2 output levels of A3 and A2 respectively clip to the minimum ground and maximum supply voltage level respectively. Therefore the output of amplifiers A2 and A3 is no longer following the ideal behavior, and can not longer follow turning on and off N1 and P1 of the differential output stage as is required to keep the quiescent current constant at the target value. The result of this is that the quiescent current increases, whereby this effect is more pronounced at higher frequencies.

Figure 3:
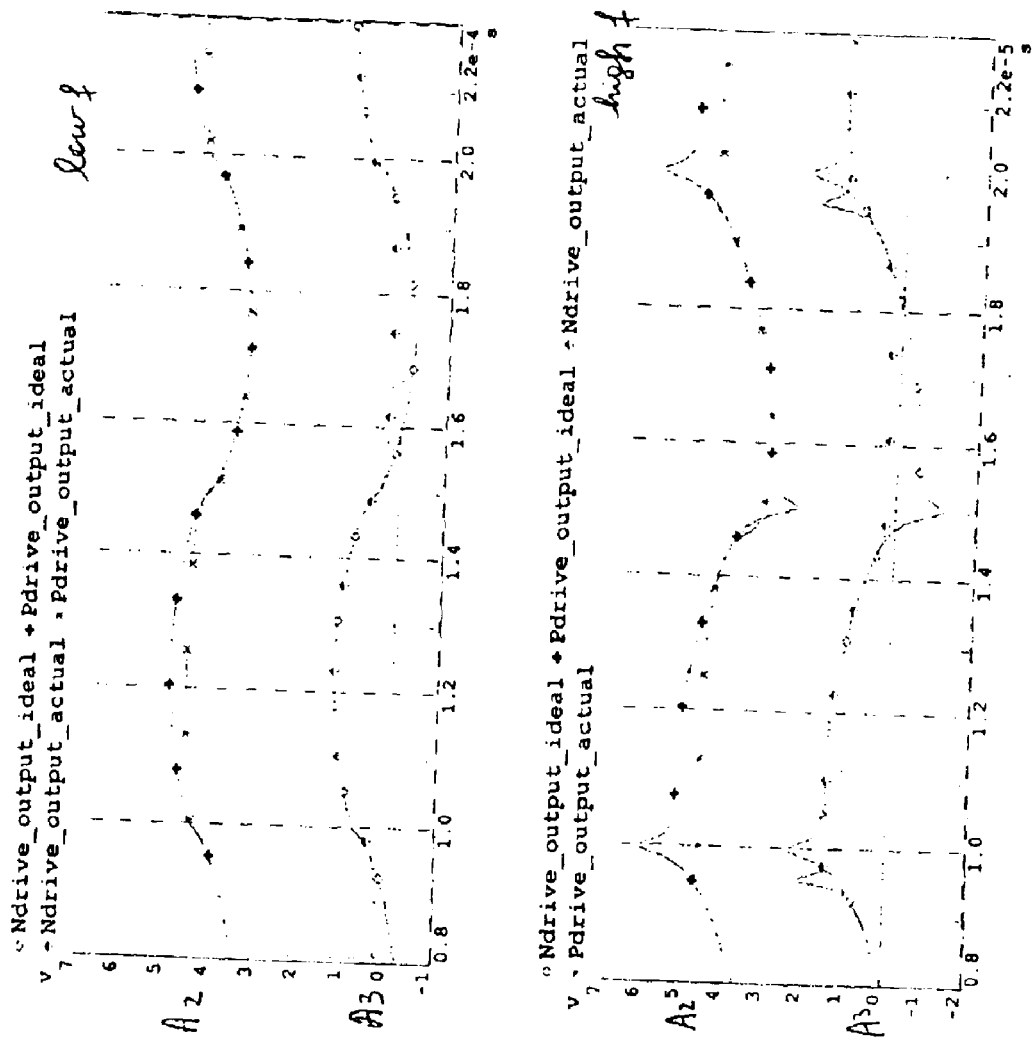
FIG. 3 shows simulation results of the output voltages of the preceding stage for low and high frequencies for a particular example.
Figure 4:
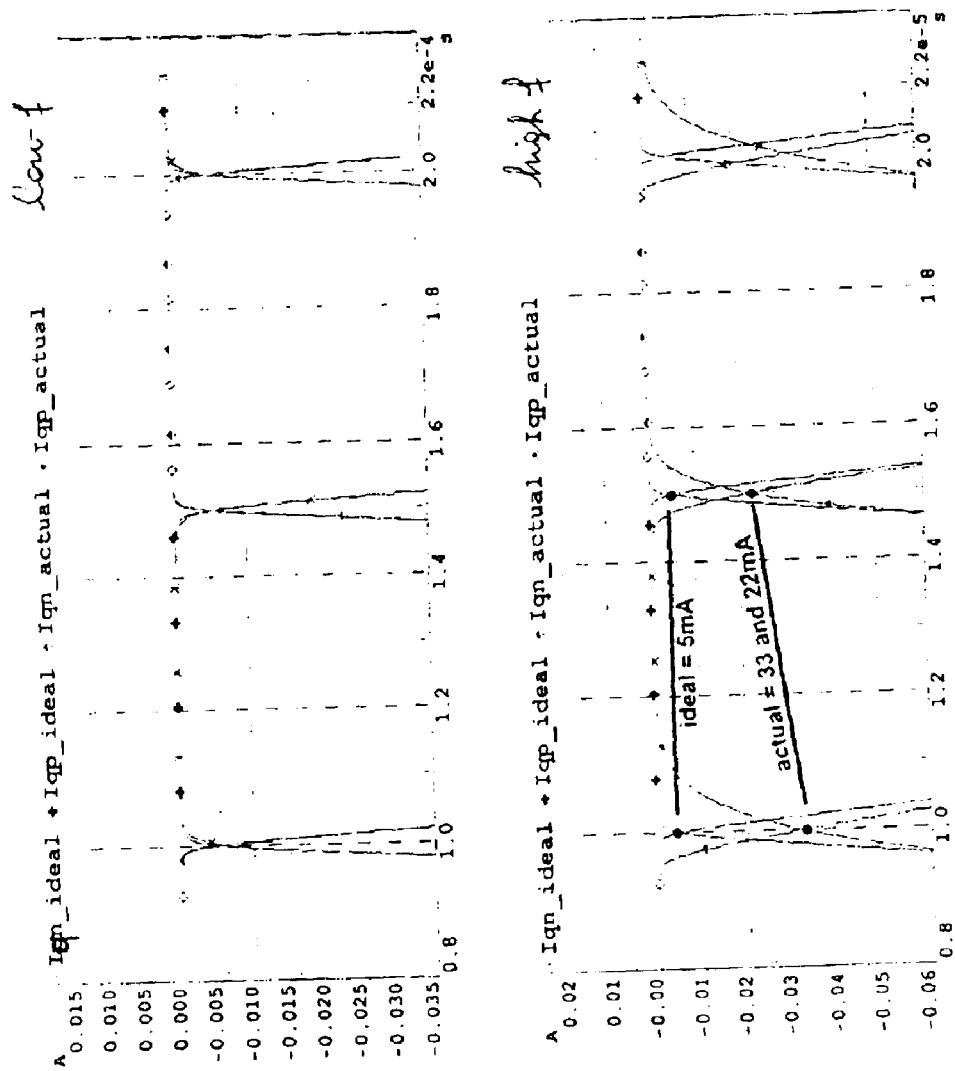
FIG. 4 shows simulation results of the quiescent current obtained at low and high frequencies for this particular example.

This can be seen at the plots of FIG. 3 where the output voltages of A2 and A3 are shown for input signals with a low frequency, denoted by low f, of 10 KHz and a high frequency, denoted by high f, and being 100 kHz respectively. The top figure of FIG. 3 shows simulation results of an ideal operational amplifier, for which no clipping should occur, and the results for the amplifiers A2 and A3 of FIG. 2, for 10 KHz. The result for the ideal A2 amplifier is denoted by "Pdrive_output_ideal", for the ideal A3 amplifier by "Ndrive_output_ideal", and the actual A2 by "Pdrive_output_actual" and the actual A3 by "Ndrive_output_ideal". The bottom plot of FIG. 3 uses the same nomenclature, but shows the results for the 100 KHz, thus the high frequency case. For the 10 KHz case the output voltage is still forming a sinewave trajectory, whereas for the 100 KHz case the clipping is clearly observed. FIG. 4 shows the quiescent current levels for the same input signals, both for the 10 KHz and the 100 KHz cases. Again the quiescent currents are also shown, and denoted by means of "Iqn_ideal" and "Iqp_ideal" respectively. From this figure it is clear that for the 10 KHz input signal the target quiescent current of 5 mA is reached. This target corresponds to the quiescent current for an ideal amplifier A2 and A3, thus these without the clipping behavior However for the 100 KHz input signal this level goes up to 33 and 22 mA, depending on the falling or rising edge in the sine waveform.

The design methodology which is thus generally followed is to first determine the needed minimum quiescent current level for the highest signal frequencies in order to obtain the same distortion levels as for the lower signal frequencies, given a target quiescent current for these lower frequencies. Next the cut-off frequency is chosen such as to guarantee the above mentioned quiescent current level for the higher frequency band and the filter characteristics are iteratively determined, usually by means of simulations, such as to obtain this desired value of the maximum quiescent current level. In general, and also in the specific ADSL output amplifier example described above, the dimensions of the output transistors are mainly determined via their current and voltage swing. From these dimensions, the input capacitance automatically follows. Given the cut-off frequency of the filter, the output impedance of the previous stage can then be automatically calculated after which step this previous stage can then be further tuned such as to obtain this output impedance value.

While the principles of the invention have been described above in connection with specific apparatus, it is to be clearly understood that this description is made only by way of example and not as a limitation on the scope of the invention, as defined in the appended claims.

What is claimed is:

1. A method for controlling the quiescent output current of an operational amplifier arrangement, said method comprising:

tuning respective input offset voltages of an amplifier stage preceding a differential output driver stage to control quiescent current of said differential output driver stage, and selecting a cut-off frequency of a filter comprised of input capacitors of said differential output driver stage and output impedance of said amplifier stage preceding said differential output driver stage, wherein said cut-off frequency is lower than a predetermined part of the maximum bandwidth of an input signal applied to said operational amplifier arrangement, and whereby said amplifier stage preceding said differential output driver stage has a limited output voltage swing.

2. An operational amplifier arrangement comprising:

an amplifier stage having a limited output voltage swing, a differential output driver stage having input terminals coupled to respective output terminals of said amplifier stage, and a quiescent current control circuit adapted to control quiescent current of said differential output driver stage by tuning respective input offset voltages of said amplifier stage preceding said differential output driver stage, wherein a filter comprised of output impedance of said amplifier stage and input capacitors of said differential output driver stage, has a cut-off frequency which is lower than a predetermined part of a maximum bandwidth of an input signal of said operational amplifier arrangement.

3. An operational amplifier arrangement according to claim 2, wherein said amplifier stage preceding said differential output driver stage comprises a pair of differential amplifiers, wherein each differential amplifier comprises a differential pair of transistors in a common emitter circuit coupled to a current source, and collector output terminals of both transistors of said differential pair being coupled via a load to supply voltage.

4. An operational amplifier arrangement according to claim 2, wherein said differential output driver stage comprises a class AB output driver.

5. An operational amplifier arrangement according to claim 2, further comprising:

a common input stage coupled to said amplifier stage, said common input stage receiving the input signal; and a feedback circuit coupled to an output of said differential output driver stage and to said common input stage.

* * * * *